United States Patent
So et al.

(10) Patent No.: US 6,727,038 B1
(45) Date of Patent: Apr. 27, 2004

(54) PHOTODEFINEABLE COMPOSITIONS

(75) Inventors: Ying Hung So, Midland, MI (US);
Cheryl L. Murlick, Saginaw, MI (US);
Daniel M. Scheck, Midland, MI (US);
Gregory S. Becker, Midland, MI (US);
Eric S. Moyer, Midland, MI (US)

(73) Assignee: Dow Global Technologies Inc., Midland, MI (US)

( * ) Notice: Subject to any disclaimer, the term of this patent is extended or adjusted under 35 U.S.C. 154(b) by 216 days.

(21) Appl. No.: 09/910,130

(22) Filed: Jul. 20, 2001

Related U.S. Application Data

(63) Continuation of application No. 08/415,956, filed on Apr. 3, 1995, now abandoned.

(51) Int. Cl.[7] ................................................. G03C 1/76
(52) U.S. Cl. ............................. 430/270.1; 430/281.1; 430/919; 430/923; 522/65; 522/172; 522/57
(58) Field of Search .......................... 430/270.1, 281.1, 430/919, 923; 522/65, 172, 57

(56) References Cited

U.S. PATENT DOCUMENTS

| | | | |
|---|---|---|---|
| 5,585,450 A | | 12/1996 | Oaks et al. ................. 526/279 |
| 5,854,302 A | | 12/1998 | Foster et al. ................ 522/172 |
| 5,882,836 A | * | 3/1999 | Foster et al. ................ 430/194 |
| 6,083,661 A | * | 7/2000 | Oaks et al. ............... 430/286.1 |

FOREIGN PATENT DOCUMENTS

| | | |
|---|---|---|
| JP | 62165644 | 7/1987 |
| WO | WO 93/12055 | 6/1993 |
| WO | WO 94/25903 | 11/1994 |

OTHER PUBLICATIONS

Moyer et al., Proceedings, IEPS, Austin, p. 37–50, (1992).
Rutter et al., Proceedings, ISHM/IEPS, Denver, p. 394–400, (Apr. 1992).
Novothy, Donald B., "Emission Apectra of an Azide Photoresist Initiator and Exposure Reciprocity," J. Electrochem. Soc. (1988), 135(3), pp. 774–775.

\* cited by examiner

*Primary Examiner*—Laura Weiner
(74) *Attorney, Agent, or Firm*—Susan Moeller Zerull

(57) ABSTRACT

A photodefineable mixture comprising oligomeric divinyltetramethyldisiloxane bisbenzocyclobutene as its major resin component dissolved in mesitylene and at least 2,6-bis(4-azidobenzylidene)-4-ethylcyclohexanone as a photosensitive agent in an amount sufficient to convert the mixture to an organic-insoluble solid upon exposing the mixture to photon radiation is disclosed. These polymer compositions are useful as thin film dielectrics in electronic applications such as multichip modules, integrated circuits and printed circuit boards.

6 Claims, No Drawings

PHOTODEFINEABLE COMPOSITIONS

This application is a continuation of Ser. No. 08/415,956 filed Apr. 3, 1995 now abandoned.

BACKGROUND OF THE INVENTION

This invention relates to photodefineable polymers.

U.S. patent application Ser. No. 290,197, filed Aug. 15, 1994; which is a continuation-in-part of U.S. patent application Ser. No. 805,395, filed Dec. 10, 1991; and which corresponds to PCT Application No. 92/10,649, filed Dec. 10, 1992 and published as 93/12,055, Jun. 24, 1993; U.S. patent application Ser. No. 224,203, filed Apr. 14, 1994; which is a continuation-in-part of U.S. patent application Ser. No. 54,999, filed Apr. 29, 1993; and which corresponds to PCT Application No. 94/04,535, filed Apr. 25, 1994 and published as 94/25,903, Nov. 10, 1994; Moyer et al., *Proceedings, IEPS*, Austin, 1992, p. 37 and Rutter et al., *Proceedings, ISHM/IEPS*, Denver, April 1992, p. 394 disclose a DVS resin that is rendered photo-curable by the addition of at least one photosensitive agent in an amount sufficient to convert the mixture to an organic-insoluble solid upon exposing the mixture to photon radiation. All of these references are incorporated herein by reference.

These DVS resin compositions are useful as thin film dielectrics in electronic applications such as multichip modules, integrated circuits and printed circuit boards.

These references disclose that a polymer of a monomer of the formula:

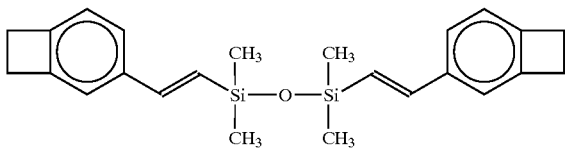

may be rendered photo-cureable by the addition of a photosensitive agent such as a bis azide.

The depictions of this monomer herein should not be construed to define any particular geometric isomer or spatial orientation about the ethenylene double bonds. Compositions made by the processes disclosed herein contain positional isomers about these double bonds as well as other compounds. This monomer will be hereinafter referred to as DVS bis BCB. A partially polymerized DVS bis BCB monomer will be hereinafter referred to as DVS resin.

The DVS bis BCB monomer can be prepared by methods disclosed in U.S. Pat. Nos. 4,812,588; 5,136,069; 5,138,081; and 5,264,646.

Following one of the disclosed procedures for making the most preferred DVS bis BCB monomer, one will obtain a mixture containing as a major component divinyltetramethyldisiloxane-bis-benzocyclobutene monomer. This monomer is partially polymerized or B-staged prior to addition of a photosensitive agent.

The most preferred group of photosensitive agents disclosed to render a DVS resin photodefineable is the azides. The azides disclosed in preparing the photodefineable polymers correspond to the formula:

Q—(N$_3$)$_x$ wherein

Q is an x-valent organic moiety, and x is an integer of 2 or more.

Bis azides of the formulae:

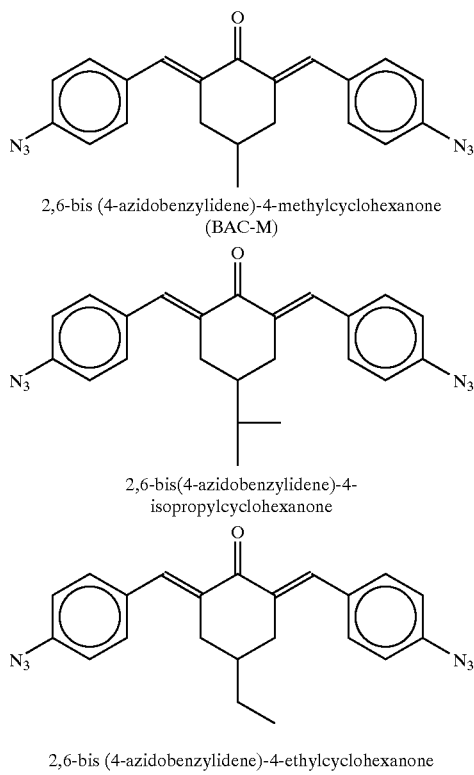

2,6-bis (4-azidobenzylidene)-4-methylcyclohexanone
(BAC-M)

2,6-bis(4-azidobenzylidene)-4-isopropylcyclohexanone 2,6-bis (4-azidobenzylidene)-4-ethylcyclohexanone among others are disclosed.

2,6-Bis(4-azidobenzylidene)-4-methylcyclohexanone (BAC-M) is exemplified as the most preferred photosensitive agent.

The formulation containing these components is not only sensitive to photon radiation but is also unstable at room temperature. The bis azide reacts to form species which will no longer render the polymer photodefineable. At room temperature, substantial changes in the formulation properties occur in as little as three days. Because of this, the formulation is stored under refrigeration. A precipitate was found after storing the formulation under refrigeration. Upon analysis, this precipitate was found to consist largely of the BAC-M bis azide. Precipitation of a formulation component is unacceptable for many users of the formulation who require consistent and predictable behavior from the formulation.

SUMMARY OF THE INVENTION

This invention is a photodefineable, organic-soluble mixture comprising DVS resin as its major resin component dissolved in mesitylene and at least 2,6-bis (4-azidobenzylidene)-4-ethylcyclohexanone as a photosensitive agent in an amount sufficient to convert the mixture to an organic-insoluble solid upon exposing the mixture to photon radiation.

The mixture of this invention may be exposed to photon radiation to form an organic-insoluble solid polymer which may be patterned by masking portions of the mixture from the photon radiation. These photo-crosslinked polymers may then be subjected to thermal curing. These photo/thermally cured polymers are useful in many applications such as thin film dielectrics in integrated circuits, multichip modules, printed circuit boards and other microelectronic devices, as passivation or overcoat layers in microelectronics, as planarization layers in flat panel displays, as binders for conductive adhesives and the like.

A feature of this invention is that the photodefineable mixture contains DVS resin as its major resin component dissolved in mesitylene and at least 2,6-bis(4-azidobenzylidene)-4-ethylcyclohexanone as a photosensitive agent.

An advantage of this invention is that the photodefineable mixture may go for months at lower temperatures to preserve the consistency of performance of the formulation and not form a precipitate.

DETAILED DESCRIPTION OF THE INVENTION

The DVS resin used in the mixture of the invention is described in the hereinbefore cited references. The DVS resin-containing portion of the formulation may be oligomerized or B-staged prior to use to improve handling, processing, and performance characteristics.

It is most preferred to have the highest molecular weight possible while maintaining a high solubility level. This will result in the maximum solubility difference between the exposed and unexposed areas of the polymer film covering the wafer or substrate.

One may obtain a DVS resin which readily crosslinks to an insoluble gel by B-staging the DVS bis BCB monomer neat and dissolving in a miscible solvent and then precipitating out the desired higher molecular weight species as disclosed in PCT publication 93/12,055, published Jun. 24, 1993. Or, one may obtain a DVS resin which readily crosslinks to an insoluble gel by B-staging the DVS bis BCB monomer dissolved in mesitylene at a concentration of 25 weight percent DVS bis BCB monomer as disclosed in PCT publication 94/25,903, published Nov. 10, 1994.

The required bis azide has the formula:

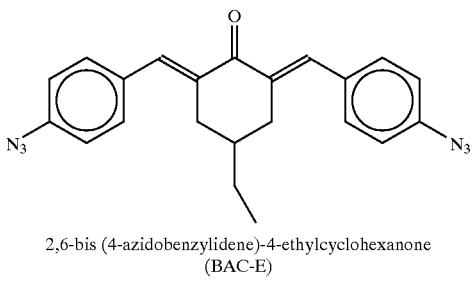

2,6-bis (4-azidobenzylidene)-4-ethylcyclohexanone
(BAC-E)

is a known material having CAS# 114391-97-8.

One may wish to use other bis azides in conjunction with BAC-E depending on the thickness of the layer of DVS resin to be patterned. BAC-E absorbs light at 365 nm. In thicker layers, this may prevent the photon radiation from penetrating the full depth of the film. BAC-E used as the sole bis azide is a good choice for thin layers such as 5 microns or less. In thicker layers such as 10 microns, one may wish to use BAC-E in conjunction with another bis azide that does not absorb at such a wavelength. Preferred second bis azides include 4,4'- or 3,3'-diazidophenyl sulfone, 4,4'- or 3,3'-diazidophenyl ether, 2,2-bis[4-(4-azidophenoxy) phenyl] propane or 2,2-bis[4-(3-azidophenoxy) phenyl)] propane. Most preferred is 2,2-bis[4-(4-azidophenoxy) phenyl] propane. The mixture containing BAC-E and 2,2-bis [4-(4-azidophenoxy) phenyl] propane may have a longer pot life at room temperature than a mixture containing BAC-M and 4,4'- or 3,3'-diazidophenyl sulfone. The mixture of the invention preferably contains no other bis azide substituted cyclohexanones.

The amounts of DVS resin and BAC-E employed in preparing the photodefineable mixture of this invention can vary. Suitable amounts are those which contain DVS resin as the major component and provide a photodefineable mixture from which photodefined organic-insoluble polymers can be prepared. A suitable amount of BAC-E is that which provides sufficient curing in the photon-exposed portion of the mixture to render it insoluble in the developing solvent. A preferred weight percent range of photosensitive agent(s) is about 0.1 to about 20 based on the sum of the weights of the photosensitive agent and the DVS resin. A more preferred weight percent range of photosensitive agent is about 1 to about 6. The most preferred weight percent range of photosensitive agent is about 2 to about 4. A preferred weight percent range of the DVS resin is about 80 to about 99.9 based on the sum of the weights of the photosensitive agent and the DVS resin. A more preferred weight percent range of the DVS resin is about 94 to about 99. The most preferred weight percent range of the DVS resin is about 96 to about 98.

The photosensitive agent can be dissolved in the partially polymerized DVS resin/solvent system by conventional means such as agitation, sonication and heating. All manipulations of the DVS resin/photo-sensitive agent mixture are preferably performed in a darkened environment to prevent premature initiation of the photosensitive reaction by photon radiation. One means of providing a suitable environment is by using working space equipped with amber filtered (yellow) lights which filter out wavelengths of less than 500 nm.

The percentage of mesitylene in the mixture of the invention is that which is sufficient to dissolve the DVS resin, the photosensitive agent and any other formulation components present. The DVS resin and the mesitylene have different viscosities. It is common to vary the quantity of mesitylene to adjust the viscosity of the mixture. A lower viscosity may be used to yield a thinner film, for example, by spin-coating.

The concentration of DVS resin in the solution and molecular weight of the DVS resin determine the viscosity of the mixture. Spin-time and speed may be used to control film quality and thickness at a particular formulation viscosity. Details of substrate coating with DVS resin films can be found in the *Journal of Electronic Materials*, Vol. 19, No. 12, 1990, which is incorporated herein by reference.

In a preferred process wherein the DVS resin formulation has a viscosity of 1100±50 cSt at 25° C., one may spin-coat the DVS resin formulation at 68° F. to 70° F. at a relative humidity of 45 to 55 percent with a spread time of ten seconds at 500 rpm and a spin time of 30 seconds at 2800 rpm. This generally yields a coating of 10 to 12 microns thick. A stream of xylene may be directed at the back of the substrate being coated to avoid dried resin (cotton candy) from adhering to the edges of the substrate.

In addition to a DVS resin, mesitylene and a photosensitive agent, some embodiments of this invention contain one or more optional components which may be added to tailor the invention's characteristics.

An antioxidant may be added to increase the formulation's oxidative stability during processing as well as in the cured resin. Antioxidants of the phenol-, sulfide-, phosphite-, and amine-type may be employed in this invention. Hindered amines are the preferred antioxidants. Hindered amines with aliphatic and aromatic moieties are more preferred antioxidants. The most preferred antioxidant is polymerized 1,2-dihydro-2,2,4-trimethylquinoline, CAS registry number 26780-96-1.

This antioxidant is available as an oligomer of the formula:

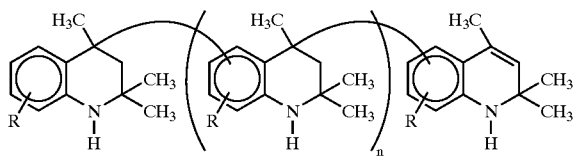

wherein R is hydrogen, an electron-withdrawing or electron-donating group and n is 0–6. Preferably R is hydrogen, but it also can be any substituent that does not interfere with the antioxidant activity of the compound.

2,2,4-Trimethyl-1,2-dihydroquinoline, wherein R is hydrogen, is available as AgeRite® MA from R. T. Vanderbilt as an oligomer with a degree of polymerization of about 3 or 4 (n is about 1 or 2).

Preferably, the optional antioxidant is employed at a weight percent range of less than 8, more preferably at a weight percent range of less than 7, and most preferably at 0.001 to 6 weight percent.

Preferably, the solvent and DVS bis BCB monomer are free of ions which would effect the dielectric properties of the final fully cured film. Exemplary ions excluded are metal ions such as alkali metal and transition metal ions, and anions such as halides, sulfates and nitrates.

Thin films of the DVS resin-containing formulation may be applied to substrates without the use of an adhesion promoter. When desirable, an optional adhesion promoter is formulated as a spray- or spin-on solution which is applied immediately before applying the DVS resin-containing formulation. Alternatively, the adhesion promoter is added to the DVS resin/photo-crosslinking agent formulation.

The adhesion promoter is designed such that one end of the molecule either covalently attaches or adsorbs to the metal, metal oxide, or ceramic substrate surface, while the second end of the molecule reacts with the DVS resin polymer matrix. Suitable adhesion promoters include trialkoxyvinylsilanes and trialkoxy-vinylsilyl benzocyclobutanes. The preparation and properties of trialkoxyvinylsilyl benzocyclobutanes are described in U.S. Pat. Nos. 4,831,172 and 5,002,808, which are incorporated herein by reference.

More preferred adhesion promoters include 3-aminopropyltriethoxysilane (3-APS), 3-methacryloxypropyl trimethoxysilane (MOPS)(CAS-02530-85-0), trimethoxyvinylsilane, triethoxyvinylsilane (TEVS), trimethoxyvinylsilyl benzocyclobutanes, and triethoxyvinylsilyl benzocyclobutanes. The most preferred adhesion promoter is 3-aminopropyltriethoxysilane (3-APS).

Suitable substrates are comprised of silicon, alumina, ceramic materials such as aluminum nitride, glasses, co-fired ceramics, copper sheet, printed circuit boards, polycrystalline diamond films, GaAs, i.e. XIII–XV semiconductors, silicon nitride films, glass ceramic and high temperature polymer films such as polyimides and polybenzazoles. More preferred substrates are comprised of alumina and silicon. The most preferred substrate is silicon.

One may apply the mixture of the invention by spin-coating, spray-coating, meniscus coating, extrusion-coating and other large area processing methods. Spin-coating is easy to control, predictable and well known and is used preferably with single wafers.

The majority of the casting solvent is removed during the spin-coating process. A softbake cycle may be required to remove residual solvent. The softbake also relaxes stress resulting from the flow of the polymer film, increases the film's adhesion to the substrate, and hardens the film for more convenient handling during processing; for example, to prevent adhesion to a mask when printing in a hard contact mode.

The softbake may be performed in a convection oven, belt oven or on a hot plate. A preferred softbake temperature is one sufficient to remove residual solvent, provide stress relaxation which requires a temperature above the polymer's glass transition temperature, but low enough to avoid oxidizing or thermal curing of the resin or undesired reactions of the formulation additives and which allows the resin to flow sufficiently to promote planarization. The preferred softbake temperature will vary depending in part on the components of the DVS resin-containing formulation. A preferred softbake temperature for DVS resin ranges from 70° C. to 120° C. The most preferred softbake temperature is 90° C. on a hot plate and 75° C. in a box oven. The softbake time is temperature dependent. The higher the temperature, the less time is needed to softbake. One minute on a hot plate at 120° C. may achieve the same result as 20 to 30 minutes in an oven at 80° C. When using BAC-E it is preferred to softbake at 75° C. in a box oven for 20 minutes because of its thermal instability.

A preferred softbake time is one sufficient to remove residual solvent, provide stress relaxation, but short enough to avoid oxidizing or thermal reaction of the resin components. The preferred softbake time will vary depending in part on the components of the cyclobutarene resin-containing formulation. A preferred softbake time for the DVS resin ranges from 15 seconds to 60 minutes. The most preferred softbake time range depends on balancing desired performance results with maximizing throughput, may vary from 15 seconds to 30 minutes. To maximize throughput, the minimum time would be optimal.

Suitable softbake atmospheres include a vacuum, solvent vapor, air, nitrogen, argon, and helium. Nitrogen is the most preferred atmosphere. Oxygen is to be avoided.

The soft baked film may then be exposed to a photon source to render portions of the film organic insoluble. Suitable photon sources include those which contain wavelengths absorbed by BAC-E. Preferred photon sources include visible light, ultraviolet light, X-rays, and electron beams. More preferred photon sources include ultraviolet and visible light. The most preferred photon source is a super high pressure mercury arc. Selective removal of various components of a high pressure mercury photon source may provide superior film performance. The dose varies depending on the film thickness and the type of photosensitive agent used. For a 10 micron thick film, suitable dose at the I-line (365 nm) is 250 to 800 mJ/cm$^2$.

One may pattern the light striking the cyclobutarene resin formulation film by passing it through a mask in projection, proximity or soft contact mode in a conventional manner.

Following photon-exposure, a softbake cycle may be employed. This cycle increases the reaction rate of long-lived photochemically generated intermediates. These intermediates have increased mobility during this cycle and thus may migrate and find a reactant species. An alternative means of increasing the mobility of these reactive intermediates is heating during photon-exposure. Such a procedure may increase the photo-sensitive agent's sensitivity.

Once photon-exposure is complete, the film is solvent developed. Solvent development comprises the use of a solvent in which photo-exposed resin is only slightly soluble and the nonphoto-exposed resin is soluble to dissolve the nonphoto-exposed resin. The dissolved resin is then removed.

Suitable developing solvents are those which selectively dissolve the nonphoton-exposed film component while minimizing swelling of the photon-exposed film.

The most preferred solvents for DVS resin film systems are Stoddard solvent and formulations of Proglyde™ DMM dipropylene glycol dimethyl ether with hydrocarbons such as Isopar™ L or Norparl™ 12. Stoddard solvent gives better film retentions but is slow to dissolve the unexposed DVS resin and has a low flash point. Proglyde™ DMM dipropylene glycol dimethyl ether gives lower film retentions but has a higher flash point and may be less toxic and teratogenic than, for example, diglyme. n-Butyl n-butyrate is a good choice for films less than 8 microns thick, but tends to cause crazing in thicker films. Triisopropyl benzene provides a wider processing window but requires additional rinses with other solvents because of its slow evaporation after use. The choice of development solvent will to some extent be governed by the users choices between these attributes.

Preferred solvent development methods include spray, puddle or immersion techniques. Spray development is a preferred technique due to its amenability to large scale production. One preferred technique is puddling solvent on the wafer, allowing it to penetrate for a period of time which can be determined by experiment. When the unexposed resin is dissolved, the wafer is rinsed in the development solvent and spun at a high speed to remove the solvent and solvent penetrated film. Preferred development methods may depend on the solvent.

For the preferred formulation for a 10 micron thick film, one may puddle 32.5 percent Proglyde™ DMM/67.5 percent Isopar™ L for 65 seconds on the wafer placed in the spin-coater. The wafer is then spun at 500 rpm for ten seconds while a stream of the same development solvent is sprayed onto the surface. The spin-speed is increased to 5,000 rpm for thirty seconds to partially dry the wafer.

One may use the DVS resin made from DVS bis BCB monomer made using the disclosed monomer synthesis, which is then solvent B-staged using a solvent B-staging procedure, with an initial concentration of 25 percent solids, to achieve an Mw of from about 140,000 to about 150,000. One may make coatings on the order of 5 to 7 microns thick using such a resin formulated with 3.11 weight percent BAC-E and 4.0 percent AgeRite® MA based on the DVS resin. This is then diluted with additional mesitylene to a viscosity of 350±17 cSt at 25° C. (about 40 percent DVS resin). One may make coatings on the order of 8 to 10 microns thick using such a resin formulated with 2.3 weight percent BAC-E, 5.0 weight percent 2,2-bis[4-(4-azidophenoxy) phenyl] propane and 4.0 weight percent AgeRite® MA based on the DVS bis BCB resin. This is then brought to a viscosity of 1100±50 cSt at 25° C. with mesitylene (about 47 percent DVS bis BCB resin). One may make coatings on the order of 20 microns or more thick using such a resin formulated with 1.5 weight percent BAC-E, 5.0 weight percent 2,2-bis[4-(4-azidophenoxy) phenyl] propane and 4.0 weight percent AgeRite® MA.

To make 20 plus micron thick films, the spin speed must be lowered to, for example, 850 rpm for low viscosity solutions or one may increase the viscosity and spin at higher speeds. In any of these options, portions of the resin are photo-cured with 365 nm wavelength light for 600 to 1000 mJ/cm$^2$. A Proglyde™ DMM development solvent is puddled on the wafer for at least 90 seconds before being spun off. For the 5 micron coating, either Stoddard solvent or n-butyl n-butyrate is an effective solvent. For the 10 and 20 micron coatings, Stoddard solvent is preferred.

The solvent developed film may be post-baked to remove solvent. The post-bake may include elevation of the temperature to 120° C. to 140° C. for 0.5 to 2 minutes. Preferably, the 10 micron film may be post-baked on a hot plate in air at 100° C. for 1 minute.

At this point in the process, for example, after passing optical inspection, the patterned thin film may have additional microcircuitry and photodefined dielectric layers applied to it or it can be further thermally cured.

Procedures for preparing multilayer interconnect units or multichip modules are disclosed in the following references which are herein incorporated by reference: J. J. Reche, "Fabrication of High Density Multichip Modules," *IEEE/CMT 1989 IEMT Symposium*, p. 104; T. Tessier et al., "Process Considerations in Fabricating Thin Film MCM's," *IEPS,496* 1989, p. 294; S. F. Hahn et al., "The Fabrication and Properties of Thermoset Films Derived from Bisbenzocyclobutene for Multilayer Applications," *Proceedings of the ACS Division of Polymeric Materials: Science and Engineering*, 59, 190, 1988; P. H. Townsend et al., "The Processing and Properties of Multilayer Interconnection Structures Using Thermoset Films Derived From Bisbenzocyclobutene," *Proceedings of the Materials Research Society*, p. 47, 1989; J. Reche et al., "High Density Multichip Module Fabrication," *The International Journal for Hybrid Microelectronics*, Vol. 13, No. 4, 1990. Additional information on preparing multichip modules may be found in "Benzocyclobutene Processing Guide For Multilayer Interconnect Fabrication (Multichip Modules)," The Dow Chemical Company, Midland, Michigan, 1991.

After being developed and spun dry, or post-baked, the remaining resin may be cured under a nitrogen atmosphere, using one of the following schedules:

For a soft cured film on which additional metal or polymer layers will be formed, one may heat at 210° C. for 40 minutes.

For a hard or finally cured film, one may heat according to the following schedule:

50° C. for 5 minutes ramp from 50° C. to 100° C. over 15 minutes

100° C. for 15 minutes ramp from 100° C. to 150° C. over 15 minutes

150° C. for 60 minutes ramp from 150° C. to 250° C. over 60 minutes

250° C. for 1 hour

20° C. continuously.

The preferred 10 micron thick film may be fully cured at 250° C. for 60 minutes.

One may also cure the resin film in an infrared belt furnace. A suitable furnace and procedure are disclosed in P. E. Garrou et al., "Rapid Thermal Cure of BCB Dielectrics," *Proceedings ECTC*, San Diego, May 1992, pp. 770–776. A Radiant Technology Corporation Model No. LA-306 infrared belt oven may be used with a nitrogen atmosphere. A soft cure may be obtained with a 1.5 minute residence at 260° C. A hard cure may be obtained with a 30-second residence at 280° C.

After curing the individual layers of DVS resin formulation, one may remove any scum remaining in the interconnect vias by exposing the coated substrate to an $O_2/CF_4$ (90/10) plasma at 300 watts, 200 mTorr for 30 seconds. The need for this may vary depending on the size and shape of the vias and the amount of scum remaining.

For making a patterned cured resin film the following is recommended. DVS bis BCB monomer is B-staged at 25 weight percent monomer in mesitylene for 46 hours at 165° C. and for sufficient time at 145° C. to obtain a viscosity of 4.4 cp at 145° C. (or 35 cSt at 25° C.) which should be equivalent to an Mw of 140,000±10,000. The DVS resin is concentrated by vacuum stripping to 54 weight percent solids (viscosity 4,000 cp at 25° C.). The DVS resin is formulated by adding 2.3 weight percent BAC-E, 5.0 weight percent 2,2-5 bis[4-(4-azidophenoxy) phenyl] propane and 4.0 weight percent AgeRite® MA antioxidant, all based on the weight of resin and diluting with mesitylene to a viscosity of 1100±50 cSt at 25° C.

This formulation may be spin-coated onto $SiO_2$, an underlying partially thermally cured DVS resin formulation or copper on a substrate to form a 10 micron thick, patterned, cured, final film. Spin-coat at 68° F. to 70° F. and 45 to 55 percent relative humidity. Spread for 10 seconds at 500 rpm and spin for 30 seconds at 2800 rpm. Rinse the backside with xylene to prevent formation of cotton candy adhering to the edges of the substrate during spinning.

Prebake at 75° C. for 20 minutes in a box oven. Photo expose through a mask with a super high pressure mercury arc, I-line (365 nm) at a dose of 300 to 600 $mJ/cm^2$. Form a puddle of Stoddard's solvent at 68° F. for 2 minutes and then rinse for 10 seconds while spinning at 500 rpm.

Remove residual developing solvent by first spinning at a faster spin speed such as 5,000 rpm and then by post-baking at 100° C. for 1 minute and then cure. Soft cure at 210° C. for 40 minutes in $N_2$ if you want to add additional layers. Hard cure at 250° C. for 60 minutes in $N_2$ for a final cure. Descum any vias which need it by exposing the coated substrate to an $O_2/CF_4$ (90/10) plasma at 300 watts, 200 mTorr for 30 to 60 seconds.

This should yield a 10 micron thick patterned film.

One property that makes polymeric insulators useful in multichip module fabrication is their ability to planarize topographical features. The definition obtainable in photoresists is limited by the wavelength of the photon source employed and thus thickness variations can be detrimental to the quality of the module produced. For this reason it is important to have good planarization.

ILLUSTRATIVE EMBODIMENTS

The following examples are given to illustrate the invention and should not be interpreted as limiting it in any way. Unless stated otherwise, all parts and percentages are given by weight. All weight percents stated are relative to the weight of the resin present in the system, excluding the solvent and other additives unless otherwise noted. The percent resin in a mixture is based on the weight of resin divided by the weight of resin plus solvent, multiplied by one hundred to obtain the percent.

Unless otherwise noted, molecular weights given are apparent molecular weights obtained by size exclusion chromatography using linear polystyrenes as standards. The molecular weights are apparent because the DVS resin is not linear and may have different response sensitivities to the detection means.

EXAMPLE 1

Solubility of BAC-E in DVS Resin/Mesitylene Formulations

The solubility of various bis azides are determined in mesitylene at 25° C. and in a mixture of 45 weight percent DVS resin in mesitylene at 10° C. The results are shown in Table I. BAC-M is 2,6-bis(4-azidobenzylidene)-4-methylcyclohexanone and differs from the bis azide of the invention by having a methyl substituent on the cyclohexanone ring instead of ethyl. BAC-P is 2,6-bis(4-azidobenzylidene)-4-n-propyl cyclohexanone and differs from the bis azide of the invention by having an n-propyl substituent on the cyclohexanone ring instead of ethyl. The weight percent in the mixture is calculated based on the total weight of mixture.

TABLE I

| | Solubility | |
|---|---|---|
| Bis Azide | In Mesitylene (g/100 mL) | In Mixture (Wt %) |
| BAC-M* | 1.7 | 1.0 |
| BAC-E | 14 | 10.4 |
| BAC-P* | 3.5 | 1.7 |

*not an example of the invention

EXAMPLE 2

Storage Stability of Mixture of Invention at Room Temperature

A 54 weight percent solids DVS resin is formulated by adding 2.3 weight percent BAC-E, 5.0 weight percent 2,2-bis[4-(4-azidophenoxy) phenyl] propane and 4.0 weight percent AgeRite® MA antioxidant, all based on the weight of resin and diluting with mesitylene to a viscosity of 1100±50 cSt at 25° C. Samples are taken periodically and spun onto a wafer at uniform conditions. The potlife is considered ended when the initial thickness of the film varies by five percent. Under these criteria the potlife of this mixture is seven days. The same DVS resin is formulated by adding 2 weight percent BAC-M, 0.75 weight percent 3,3'-diazidophenyl sulfone and 0.75 weight percent AgeRite® MA antioxidant and diluting with mesitylene to a viscosity of 1100±50 cSt at 25° C. Under these criteria the potlife of this mixture is three days. The difference is attributable to the change from 3,3'-diazidophenyl sulfone to 2,2-bis[4-(4-azidophenoxy) phenyl] propane and high dissolution speed of BAC-E compared to BAC-M (Example 4).

EXAMPLE 3

Solubility of BAC-E at −15° C.

A formulation containing 3.6 weight percent BAC-E in a mixture of 45 weight percent DVS resin in mesitylene is stored for more than five months at −15° C. No precipitate forms. A formulation containing 4.05 weight percent BAC-E in a mixture of 45 weight percent DVS resin in mesitylene is stored at −15° C. A precipitate forms in three days. A formulation containing 2.0 weight percent BAC-M in a mixture of 45 weight percent DVS resin in mesitylene is stored at −15° C. A precipitate forms in less than ten days.

EXAMPLE 4

Speed of Dissolution of BAC-E

BAC-E, up to four weight percent, is added to a mixture of 45 weight percent DVS resin in mesitylene and shaken at room temperature. The BAC-E dissolves in thirty minutes. BAC-M, at 2.0 weight percent is added to a mixture of 45 weight percent DVS resin in mesitylene and shaken at room temperature. The BAC-M requires more than eight hours of shaking to dissolve.

EXAMPLE 5

Photodefineable Mixture for Five Micron Thick Films

To a mixture containing 38 weight percent DVS resin in mesitylene is added 4.0 weight percent AgeRite® MA and 3.11 weight percent BAC-E based on the weight of resin. After dissolution, the mixture is spin-coated onto two clean bare four inch diameter silicon wafers at 2,000 rpm. The wafers are prebaked on a hot plate at 75° C. for two minutes. The average initial film thickness is 7.43 microns measured by profilometry. The films are exposed to light in the wavelength range of 350 to 450 nm through a quartz and chrome test mask to obtain an exposure dose of 175 mJ/cm$^2$ as measured at 365 nm. The films are puddle developed on a spin coater by puddling about eight mL of a 32.5 percent Proglyde™ DMM/67.5 percent Isopar™ L on the top of each for 75 seconds. The wafers are then spun at 500 rpm for ten seconds while a stream of the same development solvent is sprayed onto the surface of the wafers. The spin speed is increased to 5,000 rpm for 30 seconds to partially dry the wafers. The films are then cured at 250° C. for one hour. After cure the average film thickness is 5.59 microns or 75 percent retention of initial film thickness. Features as small as ten micron round vias are successfully patterned in the films.

EXAMPLE 6

Photodefineable Mixture for Ten Micron Thick Films

To a mixture containing 46 weight percent DVS resin in mesitylene is added 4.0 weight percent AgeRite® MA, 2.3 weight percent BAC-E and 5.0 weight percent 2,2-bis[4-(4-azidophenoxy) phenyl)] propane based on the weight of resin. After dissolution, the mixture is spin coated onto eight clean bare four inch diameter silicon wafers at 2,700 rpm. The wafers are prebaked on a hot plate at 75° C. for two minutes. The average initial film thickness is 12.6 microns measured by profilometry. The films are exposed to light in the wavelength range of 350–450 nm through a quartz and chrome test mask at various exposure doses as measured at 365 nm. The films are puddle developed on a spin-coater by puddling about eight mL of a 32.5 percent Proglyde™ DMM/67.5 percent Isopar™ L on the top of each for 65 seconds. The wafers are then spun at 500 rpm for ten seconds while a stream of the same development solvent is sprayed onto the surface of the wafers. The spin speed is increased to 5,000 rpm for thirty seconds to partially dry the wafers. The films are then cured at 250° C. for one hour. After cure the final film thickness is measured. Features as small as 25 micron round vias are successfully patterned in many of the films. Film retentions are set out in Table II.

TABLE II

| Exposure Dose mJ/cm$^2$ | Film Retention % |
|---|---|
| 1,500 | 86.7 |
| 900 | 84.3 |
| 500 | 80.4 |
| 275 | 73.7 |

What is claimed is:

1. A photodefinable mixture comprising a partially polymerized divinyltetramethyldisiloxane bisbenzocyclobutene resin as its major resin component dissolved in mesitylene and at least 2,6-bis(4-azidobenzylidene)-4-ethylcyclohexanone as a photosensitive agent in an amount of from 1 to up to less than 4 weight percent based on weight of the resin and the photosensitive agent.

2. The mixture of claim 1 further comprising a second bisazide selected from the group consisting of 4,4'- or 3,3'-diazdiophenylsulfone, 4,4'-or 3,3'-diazidophenvl ether, 2,2-bis[4-(4-azidophenoxy) phenyl] propane or 2,2-bis[4-(3-azidophenoxy) phenyl] propane.

3. The mixture of claim 2 wherein the second bisazide is 2,2-bis[4-(4-azidophenoxy) phenyl] propane.

4. The mixture of any one of claims 1 to 3 further comprising an antioxidant.

5. The mixture of claim 4 wherein the antioxidant is an oligomer of 1,2-dihydro-2,2,4-trimethylquinoline.

6. The mixture of claim 1 further characterized in that it remains free of solids upon storage at −15° C. for one month in the dark.

\* \* \* \* \*